(12) United States Patent
Church (10) Patent No.: US 9,147,613 B2
(45) Date of Patent: Sep. 29, 2015

(54) METHOD OF FORMING AN INSULATOR LAYER IN A SEMICONDUCTOR STRUCTURE AND STRUCTURES RESULTING THEREFROM

(75) Inventor: Michael D. Church, Sebastian, FL (US)

(73) Assignee: Intersil Americas LLC, Milpitas, CA (US)

( * ) Notice: Subject to any disclaimer, the term of this patent is extended or adjusted under 35 U.S.C. 154(b) by 156 days.

(21) Appl. No.: 12/942,516

(22) Filed: Nov. 9, 2010

(65) Prior Publication Data

US 2011/0272756 A1    Nov. 10, 2011

Related U.S. Application Data

(60) Provisional application No. 61/332,457, filed on May 7, 2010.

(51) Int. Cl.

| | |
|---|---|
| *H01L 21/8232* | (2006.01) |
| *H01L 21/8234* | (2006.01) |
| *H01L 27/06* | (2006.01) |
| *H01L 27/08* | (2006.01) |
| *H01L 27/088* | (2006.01) |

(52) U.S. Cl.
CPC ..... *H01L 21/823462* (2013.01); *H01L 21/823468* (2013.01); *H01L 27/0629* (2013.01); *H01L 27/0805* (2013.01); *H01L 27/088* (2013.01)

(58) Field of Classification Search
CPC .............. H01L 21/823462; H01L 21/823468; H01L 21/823578; H01L 27/1237

USPC ......... 438/213, 216, 275, 279, 287, 229–232, 438/299, 301, 303, 305–307

See application file for complete search history.

(56) References Cited

U.S. PATENT DOCUMENTS

| | | | |
|---|---|---|---|
| 5,258,333 A | 11/1993 | Shappir et al. | |
| 5,464,783 A | 11/1995 | Kim et al. | |
| 5,712,208 A | 1/1998 | Tseng et al. | |
| 5,861,347 A * | 1/1999 | Maiti et al. | 438/216 |
| 5,960,289 A | 9/1999 | Tsui et al. | |
| 6,005,270 A * | 12/1999 | Noguchi | 257/315 |
| 6,200,836 B1 * | 3/2001 | Yoo | 438/297 |
| 6,559,012 B2 * | 5/2003 | Shukuri et al. | 438/275 |
| 6,803,283 B1 * | 10/2004 | Chen | 438/275 |
| 7,378,306 B2 * | 5/2008 | Spencer et al. | 438/199 |
| 7,414,292 B2 * | 8/2008 | Ema et al. | 257/369 |
| 7,547,942 B2 * | 6/2009 | Jeon et al. | 257/324 |
| 7,635,617 B2 * | 12/2009 | Yamazaki | 438/149 |
| 7,700,995 B2 * | 4/2010 | Yasumatsu | 438/216 |

OTHER PUBLICATIONS

Van Zant, Peter, Microchip Fabrication, 5th edition, McGraw Hill, p. 69.*

* cited by examiner

*Primary Examiner* — Bryan Junge (74) *Attorney, Agent, or Firm* — Fogg & Powers LLC (57) ABSTRACT

An electronic system, method of manufacture of a semiconductor structure, and one or more semiconductor structures are disclosed. For example, a method of manufacture of a semiconductor structure is disclosed, which includes forming a first semiconductor substructure over a semiconductor substrate, forming a first spacer layer over the first semiconductor substructure and the semiconductor substrate, and forming a second semiconductor substructure over at least a portion of the first spacer layer.

10 Claims, 5 Drawing Sheets

METHOD OF FORMING AN INSULATOR LAYER IN A SEMICONDUCTOR STRUCTURE AND STRUCTURES RESULTING THEREFROM

CROSS REFERENCE TO RELATED APPLICATIONS

This application is related to U.S. Provisional Patent Application Ser. No. 61/332,457 entitled "METHOD OF FORMING AN INSULATOR LAYER IN A SEMICONDUCTOR STRUCTURE AND STRUCTURES RESULTING THEREFROM," filed on May 7, 2010 and incorporated herein by reference. This application hereby claims to the benefit of U.S. Provisional Patent Application Ser. No. 61/332,457.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which are shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be construed in a limiting sense.

In the harsh environment of outer space, electronic circuits, such as integrated circuits (ICs), are exposed to a significant amount of cosmic radiation such as, for example, gamma rays. The gamma rays strike the electronic circuits and create electron/hole pairs in the oxide layers or structures in the devices involved. The electrons move relatively freely in the oxide layers and are swept away by the electric field created by an operating voltage applied across the oxide. However, the holes are less mobile and can become trapped within the oxide. These holes have a positive charge. If a hole is located near the "top" of an oxide layer adjacent to a poly-silicon gate, the positive charge will have no effect on the performance of the device involved. However, for example, if holes are located in an oxide layer farther away from the poly-silicon gate but closer to the silicon substrate in the device, the negative impact on the performance of the device is increased. A worst-case scenario occurs if the holes are located adjacent to the silicon substrate in the device. In that case, the positive charges of the holes tend to invert the P-type silicon and accumulate the N-type silicon in the device. Consequently, for example, the P-well of an N-channel Metal-Oxide Semiconductor (NMOS) transistor device would be depleted and eventually converted to N-type silicon, and the transistor would be changed from an enhancement mode device to a depletion mode device. As a result, the threshold voltage of the transistor would be decreased, and its off-state leakage would be increased. Eventually, such a transistor becomes a "short" because it cannot be turned off.

Conversely, if the holes are located adjacent to the silicon substrate of a P-channel MOS (PMOS) transistor, the polarity of the N-well of the PMOS transistor would become more N-type, and the absolute value of the threshold voltage of that transistor would be increased. Eventually, the threshold voltage shift of such a PMOS transistor would become so severe that the device would be incapable of turning on. As such, the worst-case bias condition (e.g., positive charge on the gate relative to that of the silicon) tends to push the holes in the direction of the silicon. As discussed above, this is a worst-case condition for the transistors involved.

Some embodiments of the present invention form one or more radiation-hardened semiconductor structures (e.g., transistor, capacitor), by creating defect sites (e.g., traps) in one or more insulator (e.g., oxide) layers of the semiconductor structures involved. These defect sites are utilized to trap holes in a semiconductor device so that the holes cannot migrate toward the surface of the silicon structure in the device. In one embodiment, a portion of a deposited oxide layer is formed in conjunction with a thin thermal oxide layer in the semiconductor device to create a composite, thick gate oxide (e.g., dielectric) layer for high voltage, radiation-hardened applications. Notably, the parametric shift (e.g., shift in the threshold voltage) of the composite oxide layer is less than one-half that of a thermal oxide layer having the same thickness as that of the composite oxide layer. Since the threshold voltage of such a device is better controlled in a harsh radiation environment, other parameters of the device such as, for example, saturation drive current (Idsat) or "on" drain-to-source resistance (RDSon) are also better controlled because all of these parameters are interrelated.

More precisely, in some embodiments, a composite, thick gate oxide (e.g., dielectric) layer is formed in a semiconductor structure utilizing, for example, a Chemical Vapor Deposition (CVD), Low Pressure CVD (LPCVD), or Plasma Enhanced CVD (PECVD) process. The quality of such a composite oxide layer is far lower than that of an oxide layer formed utilizing a high temperature operation. In other words, there is no reaction of $O_2$ or $H_2O$ with the silicon to create a stoichiometrically-correct silicon oxide ($SiO_2$). Instead, a lower temperature operation is utilized in which the oxide layer (e.g., dielectric) is deposited, and not grown, on the silicon wafer. As such, these CVD, LPCVD, or PECVD reactions are not perfect and inherently include a significant density of defect sites. These defect sites are utilized to capture holes induced by radiation.

In some embodiments, utilizing such a composite gate dielectric layer that is not exclusively deposited in the semiconductor structure, the bare silicon surface inherently includes numerous broken silicon bonds, which are "daggling" (accepted term of art) and not connected to any other structure because they are located at the surface (e.g., sometimes referred to as interface traps or interface states). The process of growing the thermal oxide tends to tie up a significant number of these "daggling" bonds with oxygen. Consequently, the interface between the silicon oxide and the silicon in such a semiconductor structure is significantly improved. However, if a dielectric layer were just to be deposited in the semiconductor structure, none of the silicon bonds would be tied up, the quality of the semiconductor structure would be substandard, and it probably would be useless. This result is especially true for a MOS device structure, in which the current flow is adjacent to the interface between the silicon oxide and the silicon. Therefore, in some embodiments, a viable insulator (e.g., gate dielectric) layer is provided in a semiconductor structure, including a thin thermal oxide to minimize the number of "daggling" bonds, and a deposited dielectric (including traps) to improve the radiation hardness of the semiconductor structure involved.

Embodiments of the present invention form an insulator layer within an existing semiconductor fabrication process flow to create one or more high voltage semiconductor structures (e.g., transistor, capacitor) with minimal perturbation to the existing flow. In one embodiment, a thick gate insulator, e.g., oxide, layer is formed in a semiconductor structure utilizing a composite, dielectric material. A first portion of the composite thick gate insulator layer is a thin gate insulator, e.g., an oxide layer grown by a thermal method within the base process flow. A second portion of the composite thick gate insulator layer is formed by depositing a spacer material on the thin gate insulator layer as part or all of a deposition method that is also included within the base process flow. The resulting composite, thick gate insulator layer has superior radiation hardening qualities compared to a conventional, thermally-grown thick gate oxide layer. For example, in one embodiment, a radiation-hardened, thick gate oxide layer rated at 30-40V is formed in a semiconductor structure, with minimal perturbation to the base process flow.

In some embodiments, a MOS transistor can be formed within a base process flow, by adding only one poly-silicon deposition step and one photo-resist patterning step. However, these additional steps are low temperature operations that do not impact the thermal budget of the base process flow. Also, in some embodiments, an insulated-gate field-effect transistor (IGFET) can be formed within a base process flow, by utilizing one or more of the methods described herein.

Figure 1:
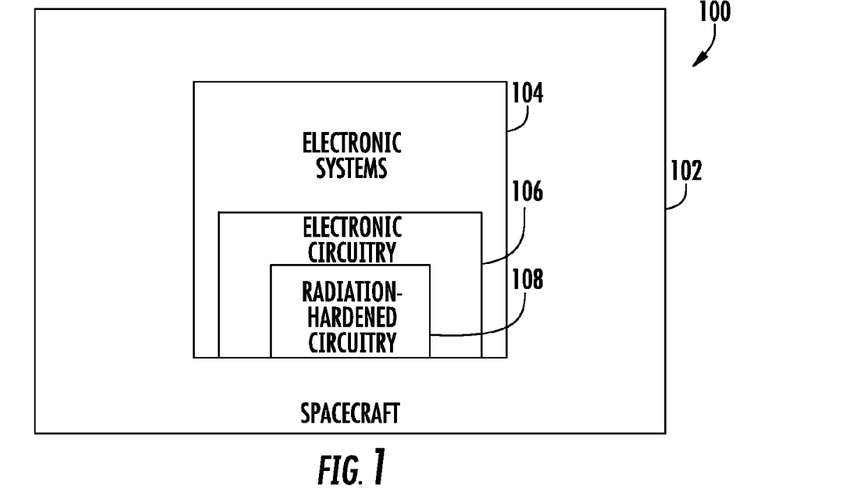
FIG. 1 is a block diagram of an exemplary system that can be utilized to implement one embodiment of the present invention.

FIG. 1 is a block diagram of an exemplary system 100, which can be utilized to implement one embodiment of the present invention. For example, system 100 can include a spacecraft 102 or other type of spaced-based platform (e.g., International Space Station or ISS, satellite, etc.). The spacecraft or space-based platform 102 includes one or more electronic systems 104, such as, for example, a communication system, navigation system, propulsion system, and/or similar other electronic systems. Each of electronic systems 104 includes one or more electronic circuits 106. At least one electronic circuit 106 includes a plurality of radiation-hardened circuits 108, whereby one or more of circuits 108 includes a plurality of transistors and/or capacitors fabricated utilizing composite, thick gate insulator (e.g., oxide) layers in accordance with embodiments of the present invention. Notably, although at least one electronic circuit 106 includes a plurality of radiation-hardened circuits, the present invention is not so limited. For example, non-radiation-hardened circuits, which also include a plurality of transistors and/or capacitors fabricated utilizing composite, thick gate insulator layers can be fabricated in accordance with embodiments of the present invention.

FIGS. 2 through 7 are related side elevation, cross-sectional in-process views of a semiconductor structure 200 that can be fabricated in accordance with one embodiment of the present invention. FIG. 8 is a flow chart showing a process 800, which can be utilized to fabricate semiconductor structure 200 shown in FIGS. 2 through 7. Note that the embodiment depicted in FIGS. 2 through 7 includes a plurality of NMOS structures (e.g., transistors). However, in a second embodiment, a complementary process 800 (e.g., substituting PLdd for NLdd, P+ for N+, and N-well regions for P-well regions) also can be utilized to fabricate a plurality of PMOS structures (e.g., transistors), by substituting suitable PMOS substructures for the NMOS substructures shown in FIGS. 2 through 7. Moreover, in a third embodiment, an extended process 800 (e.g., including PLdd, NLdd, P+ and N+ elements, and P-well and N-well regions) also can be utilized to fabricate a plurality of NMOS and PMOS structures (e.g., transistors) within the same process flow.

Figure 2:
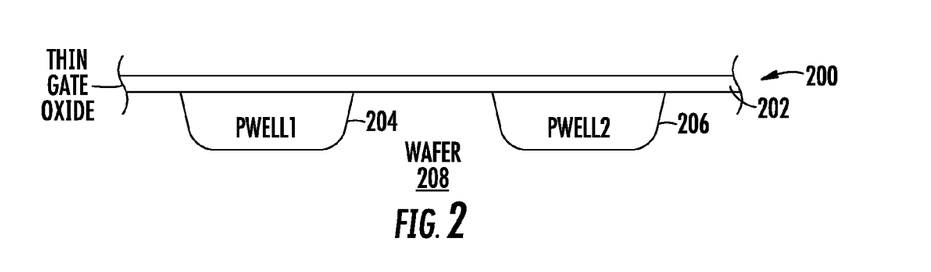
FIG. 2 is a first side elevation, cross-sectional in-process view of a semiconductor structure that can be fabricated in accordance with one embodiment of the present invention.

Referring to FIGS. 2 and 8, the first step (802) of the base process flow shown is to utilize a suitable method (e.g., thermal oxidation) to form (e.g., grow) a thin gate insulator (e.g., oxide) layer on two well (e.g., P-well) regions of a semiconductor (e.g., silicon) wafer or substrate, such as thin gate insulator layer 202, first well region 204, second well region 206, and semiconductor wafer 208. Note that the first and second well regions 204, 206 may or may not be the same junctions. In one embodiment, the thin gate insulator layer 202 is a thin gate oxide layer rated at approximately 5V. For example, gate growth can be accomplished in a diffusion tube utilizing an oxidizing ambient such as $O_2$, or $H_2$ and $O_2$. Also, for example, an inert carrier gas can be utilized, such as $N_2$ or Ar, to dilute the oxidizing ambient. A source of chlorine also can be utilized.

Figure 3:
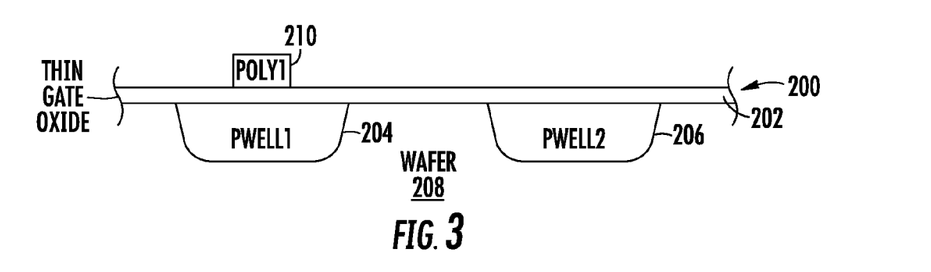
FIG. 3 is a second side elevation, cross-sectional in-process view of the semiconductor structure shown in FIG. 2, which can be fabricated in accordance with one embodiment of the present invention.

Next, utilizing a suitable deposition method (step 804), a first semiconductor (e.g., poly-silicon) substructure is deposited on the thin gate insulator layer 202 over first well region 204, such as first semiconductor substructure 210 shown in FIG. 3. For example, the first semiconductor substructure 210 can be deposited utilizing an LPCVD method. As an optional step (806), if a specific electrical conductivity for first semiconductor substructure 210 is desired, a suitable dopant material and doping method can be utilized to obtain the desired electrical conductivity for first semiconductor substructure 210. A suitable photo-resist patterning method is then utilized to further define the physical properties of first semiconductor substructure 210 (step 808). Next, utilizing a suitable etching method (step 810), these defined regions of first semiconductor substructure 210 are etched to produce the desired physical result. As a second optional step (812), a suitable oxidization method can be utilized to further define the electrical properties of first semiconductor substructure 210, if such further definition is desired.

Figure 4:
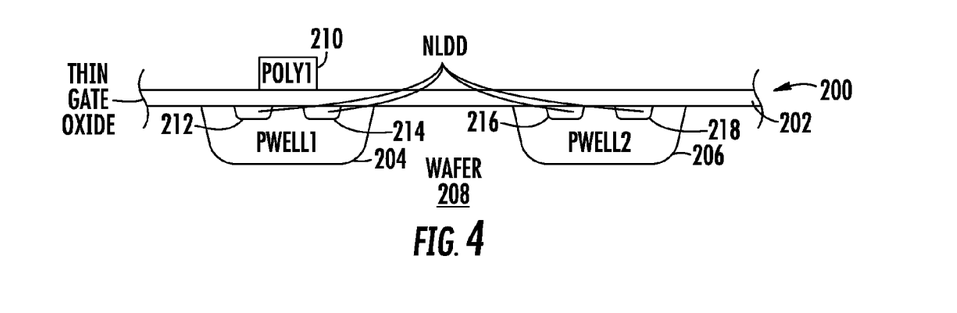
FIG. 4 is a third side elevation, cross-sectional in-process view of the semiconductor structure shown in FIG. 2, which can be fabricated in accordance with one embodiment of the present invention.

Next, a suitable photo-resist patterning method is utilized to define a plurality of drain (e.g., N-channel Lightly-doped drain or NLdd) implant regions in first well region 204 and second well region 206 (step 814), such as the drain implant regions 212, 214, 216, 218 shown in FIG. 4. The so-defined drain implant regions are then implanted with a desired implant species and dose (step 816) to produce implanted drain regions 212, 214, 216, 218. For example, for implanting the drain regions, high voltages can be utilized to accelerate certain ionized elements, such as Boron, Phosphorus, Arsenic, Antimony and the like, or ionized molecules such as $BF_2$. Utilizing a suitable deposition method (step 818), a first spacer layer is then deposited on thin gate insulator layer 202 and first semiconductor substructure 210, such as first spacer layer 220 shown in FIG. 5.

Figure 5:
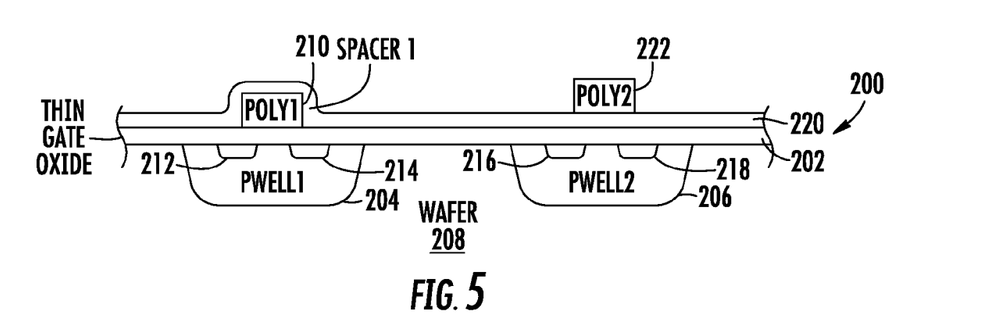
FIG. 5 is a fourth side elevation, cross-sectional in-process view of the semiconductor structure shown in FIG. 2, which can be fabricated in accordance with one embodiment of the present invention.

First spacer layer 220 can be formed utilizing one of various methods or chemical processes, such as, for example, a PECVD process, an LPCVD process, or an atmospheric deposition process. If a PECVD process is utilized, it can be a single frequency or dual frequency deposition process. Also, for example, first spacer layer 220 can be formed utilizing a dielectric material, such as a silicon oxide, silicon nitride, or combination silicon oxynitride material. If a silicon oxide material is utilized, the silicon source can be, for example, Silane ($SiH_4$) or Tetra-Ethyl-Ortho-Silicate/Oxide (TEOS/$O_2$ or TEOS/$O_3$).

Notably, purely as a design constraint, the thickness and composition of first spacer layer 220 and thin gate insulator layer 202 can be specified to obtain a predetermined voltage rating for the composite, thick gate insulator layer involved. For example, in one embodiment, the thickness and composition of first spacer layer 220 and thin gate insulator layer 202 can be specified to obtain a voltage rating of 30-40V for the composite, thick gate insulator layer 202, 220.

Next, utilizing a suitable deposition method (step 820), a second semiconductor (e.g., poly-silicon) substructure is deposited on first spacer layer 220 over second well region 206, such as second semiconductor substructure 222 shown in FIG. 5. A suitable photo-resist patterning method is then utilized to further define the physical properties of second semiconductor substructure 222 (step 822). Utilizing a suitable etching method (step 824), these defined regions of second semiconductor substructure 222 are then etched to produce the desired physical result. As an additional optional step, a suitable oxidization method can then be utilized to further define the electrical properties of second semiconductor substructure 222 (step 826).

Figure 6:
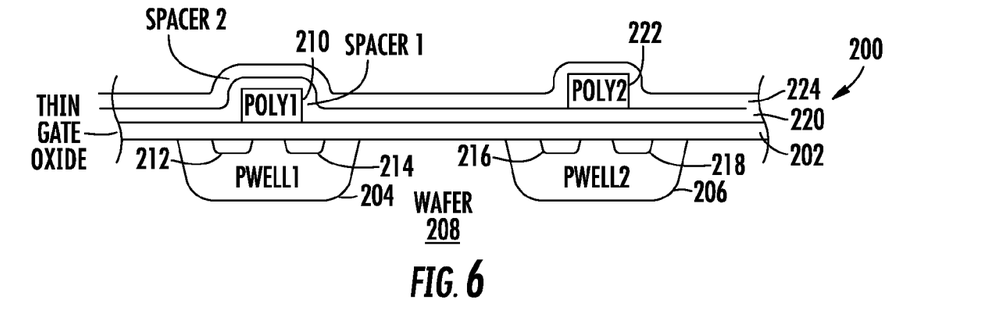
FIG. 6 is a fifth side elevation, cross-sectional in-process view of the semiconductor structure shown in FIG. 2, which can be fabricated in accordance with one embodiment of the present invention.

Next, utilizing a suitable deposition method (step 828), a second spacer layer is deposited on first spacer layer 220 and second semiconductor substructure 222, such as second spacer layer 224 shown in FIG. 6. Note that, purely as a design constraint, the thickness and composition selected for each spacer layer 220, 224 can affect the quality of the semiconductor structures produced. For example, in order to maintain perfect compatibility between the semiconductor structures produced by the process flow depicted in FIG. 8, both the composition and the sum total thickness of the first spacer layer 220 and the second spacer layer 224 should remain the same as the base process. However, the individual thickness of each spacer layer 220, 224 can be different. For example, in one embodiment, the total thickness of the deposited spacer layers 220, 224 is equal to the thickness of a single spacer layer utilized in the conventional base process flow. In other words, although the quality and yield of the semiconductor structures produced may be reduced, the thickness and composition of the two spacer layers 220, 224 can be different. For example, assume that a spacer layer in the base process has a thickness of 2000 Angstroms. Consequently, in one embodiment, the thickness of the first spacer layer 220 and the second spacer layer 224 could be 1000 Angstroms each. However, for a different embodiment, the thickness of the first spacer layer 220 could be 700 Angstroms, and the second spacer layer 224 could be 1300 Angstroms thick. As such, the quality or yield of the semiconductors produced would not be affected as long as the total thickness remains constant. However, if instead, the thickness of first spacer layer 220 is selected to be 1300 Angstroms, and the thickness of second spacer layer 224 is selected to be 500 Angstroms for some reason, then this total thickness would depart from the base flow and the product characteristics, quality or yield could be compromised.

As such, in one embodiment, an acceptable compatibility between semiconductor structures can be maintained by utilizing a first spacer layer 220 that is 700 Angstroms thick and a second spacer layer 224 that is 1300 Angstroms thick. In any event, as mentioned above, in order to maintain perfect compatibility between the semiconductor structures produced, the combined thickness of first spacer layer 220 and second spacer layer 224 (e.g., 2000 Angstroms) should be equal to the thickness of the single spacer layer utilized in the conventional process flow. Furthermore, the thickness of first spacer layer 220 can be custom-tailored for a particular voltage specification. In that regard, the highest voltage ratings available for the composite, thick gate insulator layer can be produced as the thickness of second spacer layer 224 approaches zero.

The combined thickness of first spacer layer 220 and second spacer layer 224 can be any thickness within the range between 500 Angstroms and 5000 Angstroms. Just how the total thickness is split depends on the voltage rating of the thick, composite gate. For example, the higher the voltage rating desired for the thick, composite gate, the thicker the first spacer layer 220 has to be. In some embodiments, for example, a first spacer layer 220 can be utilized that is 1200 Angstroms thick and a second spacer layer 224 that is 2800 Angstroms thick. In other embodiments, for example, a first spacer layer 220 can be utilized that is 1500 Angstroms thick and a second spacer layer 224 that is 3500 Angstroms thick, and so on for other thickness combinations.

As described above, the composition of first spacer layer 220 may be different than that of second spacer layer 224. As such, second spacer layer 224 can be formed utilizing one of various methods or chemical processes, such as, for example, a PECVD process, an LPCVD process, or an atmospheric deposition process. If a PECVD process is utilized, the process can be a single frequency or dual frequency deposition process. Also, for example, second spacer layer 224 can be formed utilizing a dielectric material, such as a silicon oxide, a silicon nitride, or a combination silicon oxynitride material.

If a silicon oxide material is utilized, the silicon source can be, for example, Silane ($SiH_4$) or Tetra-Ethyl-Ortho-Silicate/Oxide ($TEOS/O_2$ or $TEOS/O_3$).

Figure 7:
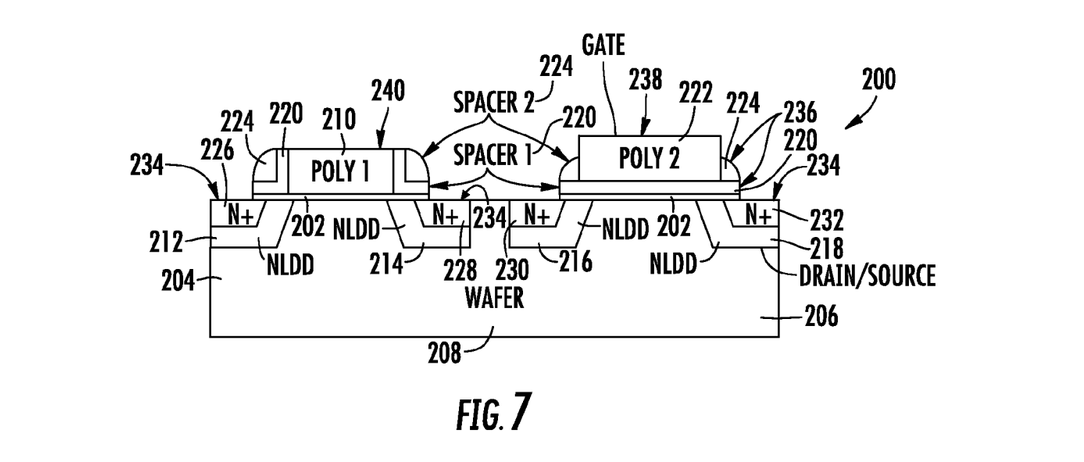
FIG. 7 is a sixth side elevation, cross-sectional in-process view of the semiconductor structure shown in FIG. 2, which can be fabricated in accordance with one embodiment of the present invention.
Figure 8:
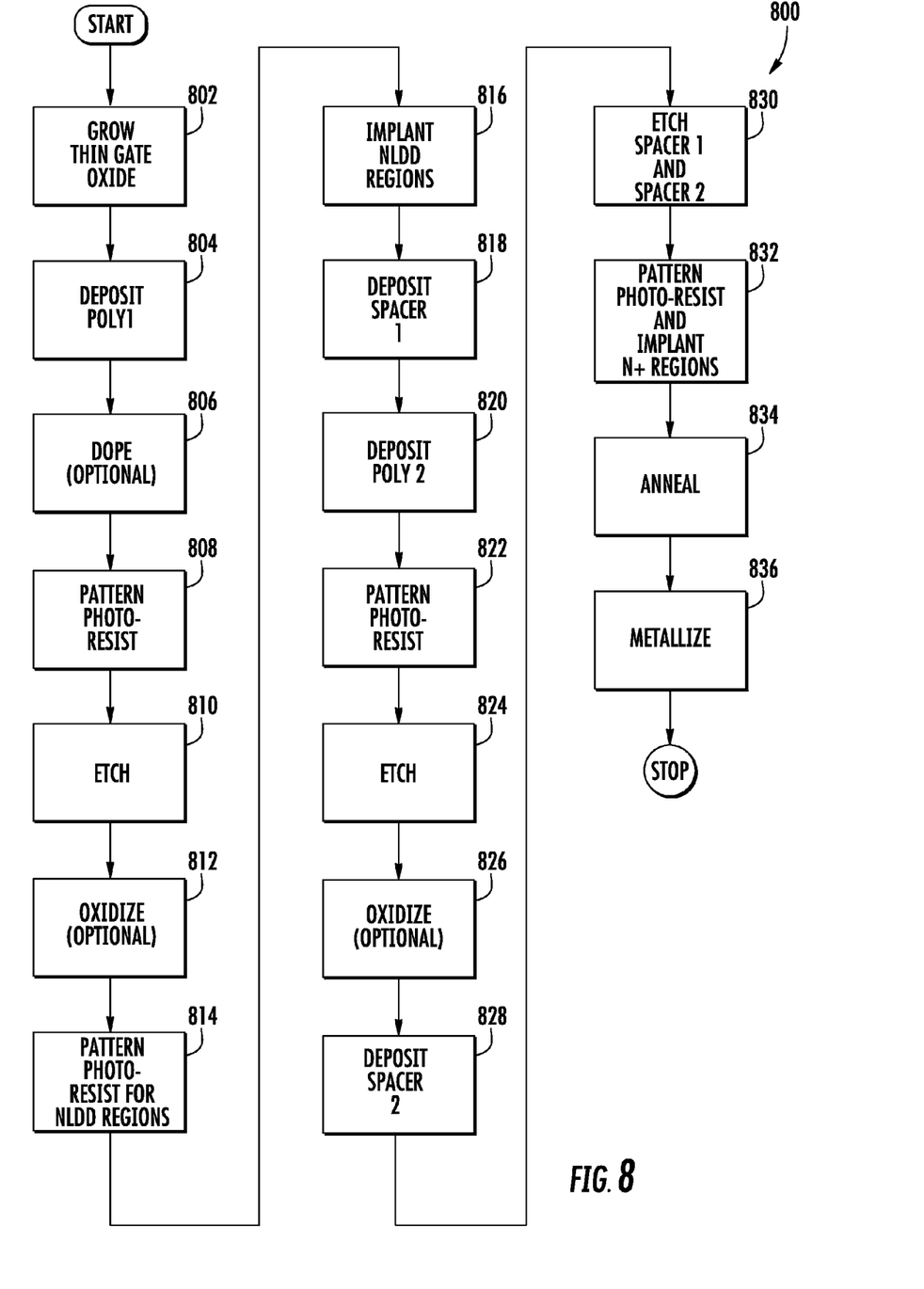
FIG. 8 is a flow chart showing a process that can be utilized to fabricate the semiconductor structures shown in FIGS. 2 through 7.

Returning to FIG. 8, utilizing a suitable etching method (step 830), the regions of first spacer layer 220 and second spacer layer 224 previously defined at steps 808, 822 are then etched to produce semiconductor structure 200 shown in FIG. 7. Note that in FIG. 7, the etching step 830 exposes a first surface region 234 where the thin gate insulator layer 202 is not protected by the first and second semiconductor substructures 210, 222 and the first and second spacer layers 220, 224. Note that the etching step also exposes a portion of the wafer 208. As such, the thin gate insulator layer 202 will not be removed where it is protected by either the first and second semiconductor substructures 210, 222 or the first and second spacer layers 220, 224 formed along the sidewalls of the first and second semiconductor substructures 210, 222. As a result, a second surface region 236 of first spacer layer 220 and second spacer layer 224, a third surface region 238 of second semiconductor substructure 222, and a fourth surface region 240 of first semiconductor substructure 210 are exposed. Utilizing a suitable photo-resist patterning method (step 832), a secondary (e.g., N+) implant region is defined in each drain or source region 212, 214, and drain or source region 216, 218, such as secondary implant regions 226, 228, 230, 232 shown in FIG. 7. In one embodiment, for example, one of regions 212, 214 (or 216, 218) is a source and the other region is a drain. The defined secondary implant regions are implanted with a desired implant species and dose to produce secondary implant regions 226, 228, 230, 232. Utilizing a suitable annealing method (step 834), semiconductor structure 200 can be annealed to fix the electrical properties of the semiconductor materials utilized in the structure involved. The semiconductor substructures in structure 200 can then be metallized (step 836) in accordance with a suitable metallization technique. Note that, for clarity and ease of understanding, the first and second well regions 204, 206 are not explicitly shown in FIG. 7. However, the locations of such well regions are shown in FIGS. 2 through 6 and, therefore, their locations in FIG. 7 should be readily understood. Also, note that in some embodiments, and merely as a design preference, a suitable metal material can be utilized, for example, as a gate material in semiconductor structure 200, in lieu of a poly-silicon material if desired.

Figure 9:
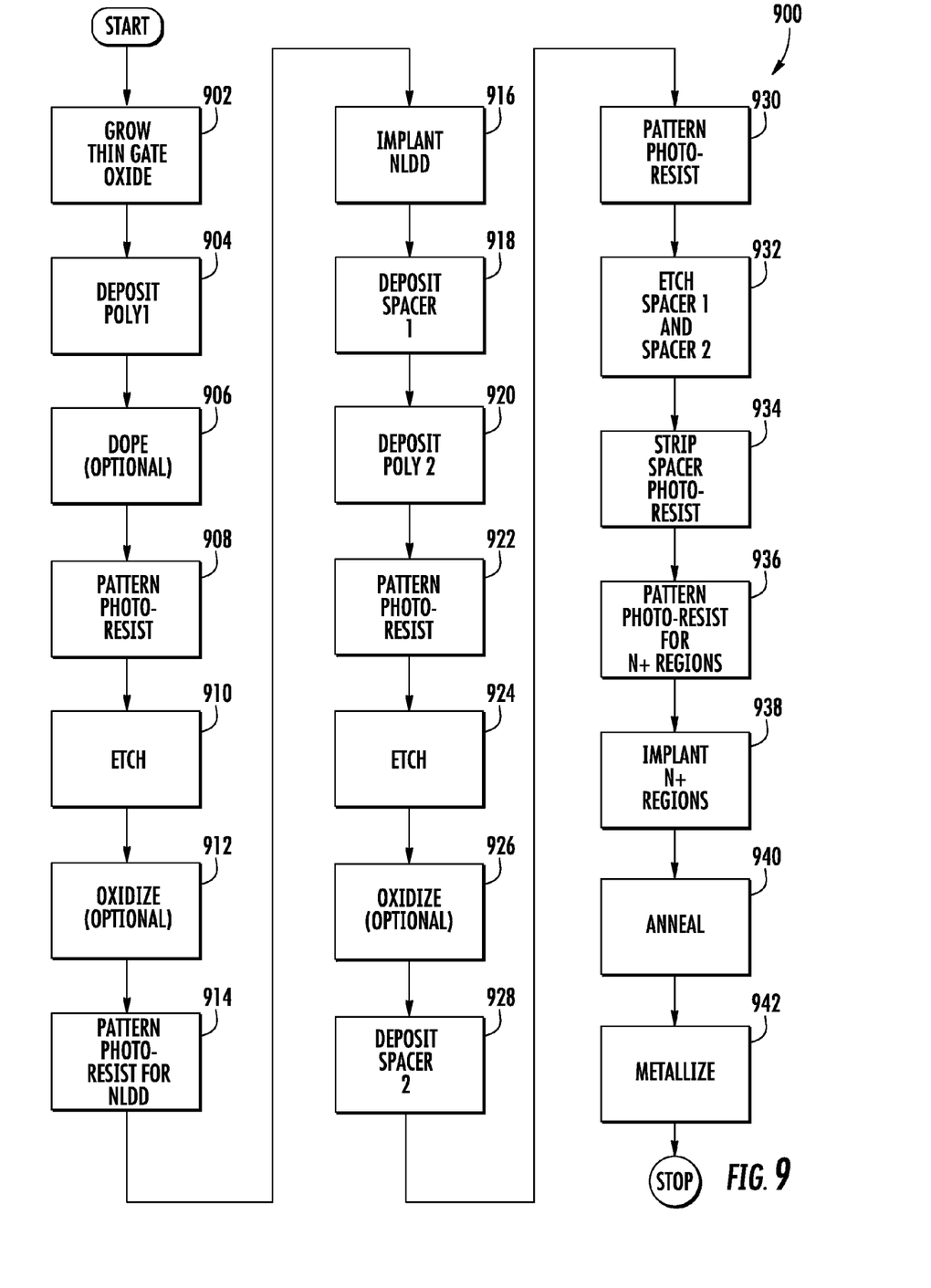
FIG. 9 is a flow chart showing a process that can be utilized to fabricate the semiconductor structures shown in FIGS. 10, 11, and 12.
Figure 10:
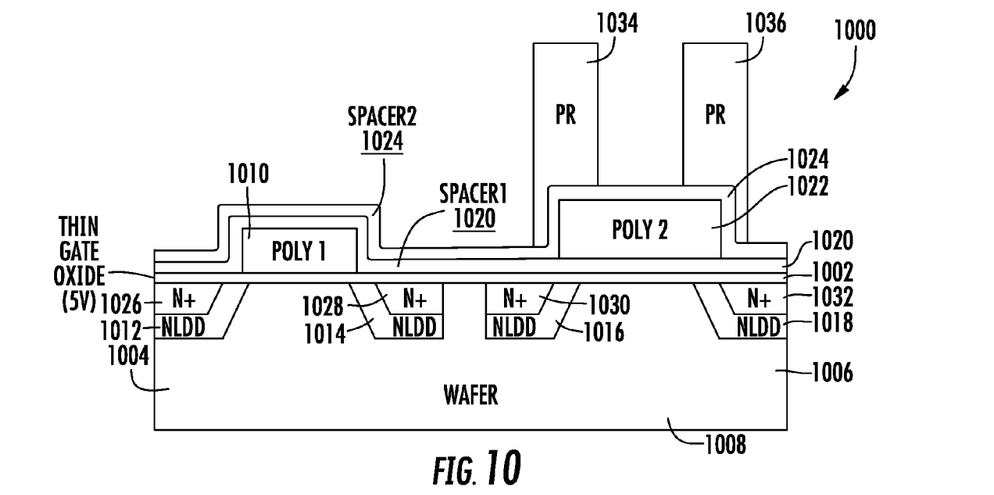
FIG. 10 is a first side elevation, cross-sectional view of a semiconductor structure that can be fabricated in accordance with a second embodiment of the present invention.
Figure 11:
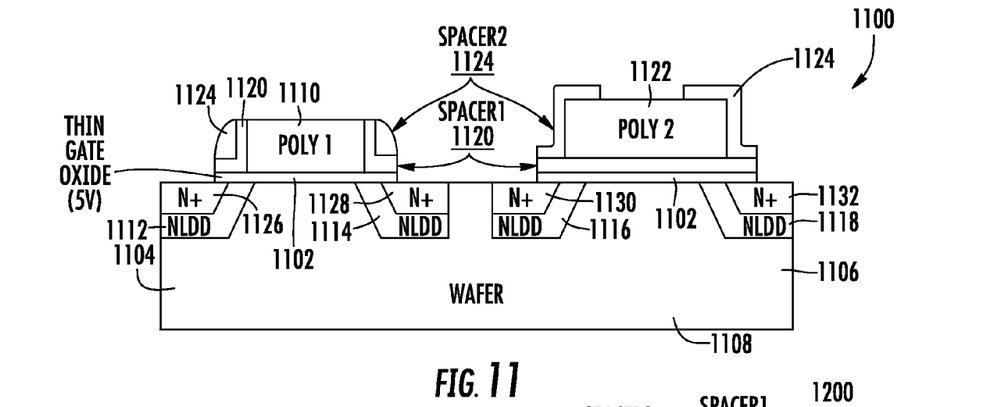
FIG. 11 is a second side elevation, cross-sectional view of the semiconductor structure shown in FIG. 10, which can be fabricated in accordance with a second embodiment of the present invention.

FIGS. 10 and 11 are side elevation, cross-sectional views of related semiconductor structures 1000, 1100 that can be fabricated in accordance with a second embodiment of the present invention. FIG. 9 is a flow chart showing a process 900, which can be utilized to fabricate semiconductor structures 1000, 1100 shown in FIGS. 10 and 11 (also, for example, semiconductor structure 1200 shown in FIG. 12). Note again that the embodiment depicted in FIGS. 10 and 11 includes a plurality of NMOS structures. However, in a second embodiment, process 900 also can be utilized to fabricate a plurality of PMOS structures, by substituting suitable PMOS substructures for the NMOS substructures shown in FIGS. 10 and 11. In some embodiments, process 900 can also be utilized to fabricate a plurality of NMOS and PMOS structures in a semiconductor structure (e.g., semiconductor structure 1000 or 1100).

Referring to FIG. 9 and comparing it to FIG. 8, note that steps 902 through 928 in FIG. 9 are substantially the same as steps 802 through 828 depicted in FIG. 8. Consequently, for brevity, the following description incorporates the above-described details of steps 802 through 828 and begins the process flow description for FIG. 9 at step 930.

In that regard, referring first to FIG. 10, a semiconductor structure 1000 is shown. Semiconductor structure 1000 includes a thin gate insulator (e.g., oxide) layer 1002 grown on a first well (e.g., P-well) region 1004 and a second well (e.g., P-well) region 1006 of a semiconductor (e.g., silicon) wafer or substrate 1008. Note that, for clarity and ease of understanding, the first and second well regions 1004, 1006 are not explicitly shown in FIG. 10. However, the locations of such well regions are shown in FIGS. 2 through 6 and should be understood. Semiconductor structure 1000 also includes a first semiconductor (e.g., poly-silicon) substructure 1010 deposited on thin gate insulator layer 1002 over first well region 1004, and a first spacer layer 1020 deposited on first semiconductor substructure 1010 and thin gate insulator layer 1002. A second semiconductor (e.g., poly-silicon) substructure 1022 is deposited on first spacer layer 1020 over second well region 1006, and a second spacer layer 1024 is deposited on first spacer layer 1020 and second semiconductor substructure 1022. Also, a plurality of drain or source (e.g., NLdd) regions 1012, 1014, 1016, 1018 are implanted in first and second well regions 1004, 1006. In one embodiment, for example, one of regions 1012, 1014 (or 1016, 1018) is a source and the other region is a drain.

Referring now to FIG. 9, process 900 begins (step 930) by utilizing a suitable photo-resist patterning method to define a desired exposure to produce a desired result. For example, FIG. 10 shows a first photo-resist 1034 and second photo-resist 1036, which are positioned to expose a specified portion of first spacer layer 1020 and a specified portion of second spacer layer 1024. As such, utilizing a suitable etching method (step 932), first spacer layer 1020 and second spacer layer 1024 are etched to produce the resulting semiconductor structure 1100 shown in FIG. 11. The photo-resists 1034, 1036 are then stripped utilizing a suitable stripping method (step 934). Note that, for ease of understanding, the photo-resists 1034, 1036 and a plurality of N+ regions (described directly below) are shown together in FIG. 10. However, it should be understood that such N+ regions are typically not formed until after the photo-resists 1034, 1036 are stripped (e.g., subsequent to step 934).

Utilizing a suitable photo-resist patterning method (step 936), a secondary (e.g., N+) implant region is defined in each drain or source region 1012, 1014, and each drain or source region 1016, 1018, such as secondary implant regions 1026, 1028, 1030, 1032 shown in FIG. 10. The defined secondary implant regions are implanted with a desired implant species and dose to produce secondary implant regions 1026, 1028, 1030, 1032 (step 938). Utilizing a suitable annealing method (step 940), semiconductor structure 1000 can be annealed to fix the electrical properties of the semiconductor materials utilized in the structure involved. The semiconductor substructures in structure 1000 can then be metallized (step 942). Note that in some embodiments, and merely as a design preference, a suitable metal material can be utilized, for example, as a gate material in semiconductor structure 1000, in lieu of a poly-silicon material if desired.

Referring now to FIG. 11, a semiconductor structure 1100 formed in accordance with steps 902 through 934 of process 900 is shown. Notably, semiconductor structure 1100 includes a first spacer layer 1120 and second spacer layer 1124, respectively, that abut semiconductor (e.g., poly-silicon) substructures 1110 and 1122. Notably, as described above, as a design constraint, the thickness and composition of each spacer layer 1120, 1124 may or may not be the same.

Note that a design feature of semiconductor structure 1100 is that the side-walls of second semiconductor substructure 1122 are completely protected by the second spacer layer 1124. For example, if the spacer layer abutting the side-walls of the second semiconductor substructure is etched too far down (e.g., see FIG. 7), then the yield can be reduced for the fabrication process utilized.

Figure 12:
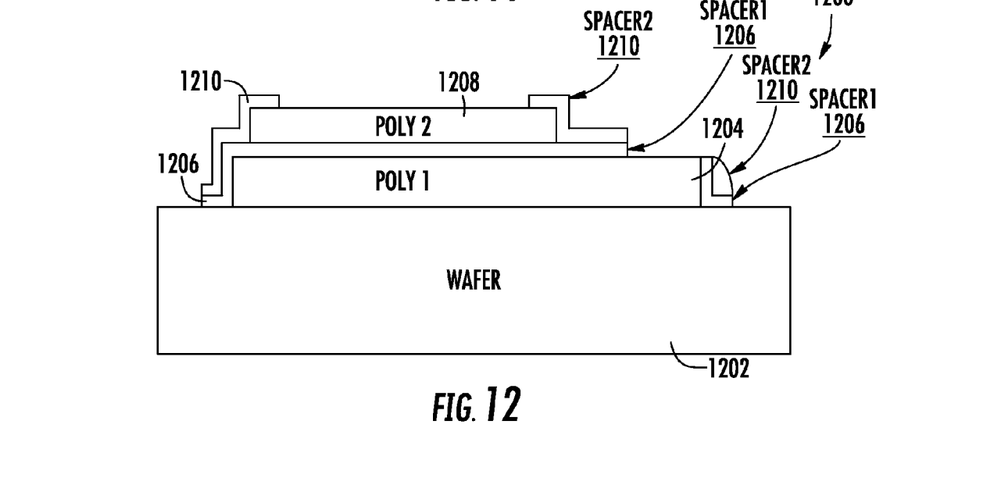
FIG. 12 is a side elevation, cross-sectional view of a semiconductor structure that can be fabricated in accordance with a third embodiment of the present invention.

FIG. 12 is a side elevation, cross-sectional view of a semiconductor structure 1200 that can be fabricated in accordance with a third embodiment of the present invention. Specifically, utilizing one or more of the above-described processes to form a poly-silicon substructure utilizing the above-described split-spacer approach, a high voltage semiconductor capacitor structure can be produced. For example, referring to FIG. 12, a semiconductor structure 1200 is shown, which includes a first poly-silicon substructure 1204 deposited on a silicon wafer or substrate 1202. Note that a layer of a dielectric material is typically deposited between first poly-silicon substructure 1204 and silicon wafer 1202. For example, the dielectric material can be an oxide material formed utilizing a Local Oxidation Of Silicon (LOCOS) process, or the dielectric material can be a shallow trench isolation oxide material formed in the base flow process involved. A first spacer layer 1206 is deposited on silicon wafer 1202 and first poly-silicon substructure 1204. A second poly-silicon substructure 1208 is deposited on first spacer layer 1206. A second spacer layer 1210 is deposited on first spacer layer 1206 and second poly-silicon substructure 1208. Subsequent to etching, desired areas of first and second poly-silicon substructures 1204, 1208 are exposed, and as a result, composite spacer layers 1206, 1210 abut the side-walls of first poly-silicon substructure 1204, and second spacer layer 1210 abuts the side-walls of second poly-silicon substructure 1208. Notably, embodiments of the present invention can be implemented to form a "free" poly-silicon to poly-silicon capacitor, in the sense that a high voltage semiconductor capacitor can be formed without significantly altering or affecting the thermal budget or methods utilized for the base process flow involved.

Notably, as described above, embodiments of the present invention can include one or more spacer layers and two semiconductor substructures. However, in other embodiments, two or more spacer layers and two semiconductor substructures can be utilized. For example, three spacer layers can be formed having a total thickness approximately equal to that of a single spacer formed in the conventional base process flow, and three semiconductor substructures can be formed. Consequently, for example, a first transistor can be formed utilizing the thermally-grown thin gate oxide layer and a first semiconductor substructure. A higher voltage transistor can be formed utilizing the thermally-grown thin gate oxide layer, the first spacer layer, and a second semiconductor substructure. An even higher voltage transistor can be formed utilizing the thermally-grown thin gate oxide layer, a first spacer layer, a second spacer layer, and a third semiconductor substructure. In other embodiments, more than three spacer layers and three semiconductor substructures may be utilized.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that the present invention be limited only by the claims and the equivalents thereof.

What is claimed is:

1. A method of manufacture of a plurality of semiconductor structures, comprising:
   growing a thin gate insulator layer on, and in direct physical contact with, a surface of a semiconductor wafer and a surface of a first well and a second well of a first conductivity type;
   depositing a first semiconductor substructure on the thin gate insulator layer and over the first well;
   depositing a first spacer layer on a portion of the thin gate insulator layer and on the first semiconductor substructure;
   depositing a second semiconductor substructure on the first spacer layer and over the second well;
   depositing a second spacer layer over the first semiconductor substructure and on the first spacer layer and the second semiconductor substructure;
   etching and exposing a first surface region including the first spacer layer and the second spacer layer, a second surface region including the thin gate insulator layer, a third surface region including the first semiconductor substructure, and a fourth surface region including the second semiconductor substructure; and thereby:
   forming the first spacer layer adjacent to and in direct physical contact with a side-wall of the first semiconductor substructure;
   forming the second spacer layer adjacent to the first spacer layer and over the side-wall of the first semiconductor substructure; and
   forming the second spacer layer adjacent to a portion of a side-wall of the second semiconductor substructure.

2. The method of claim 1, wherein the etching comprises exposing a surface of the first semiconductor substructure, a surface of the second semiconductor substructure, and a surface of a composite thick gate insulator layer, wherein the second spacer layer is adjacent to a portion of at least one side-wall of the second semiconductor substructure.

3. The method of claim 1, wherein the etching comprises exposing a surface of the first semiconductor substructure, a surface of the second semiconductor substructure, and a surface of a composite thick gate insulator layer, wherein the second spacer layer is adjacent to at least one entire side-wall of the second semiconductor substructure.

4. The method of claim 1, further comprising:
   implanting a plurality of Lightly-Doped Drain (LDD) regions of a second conductivity type in the first well and the second well; and
   implanting a plurality of regions of the second conductivity type in each of the plurality of LDD regions.

5. The method of claim 4, wherein a first plurality of the LDD regions are self-aligned to the first semiconductor substructure, and a second plurality of the LDD regions are not self-aligned to the second semiconductor substructure.

6. The method of claim 1, further comprising:
   implanting a plurality of N-channel LDD (NLDD) regions in a first P-well and a second P-well;
   implanting a plurality of N+ regions in each of the plurality of NLDD regions; and
   forming a plurality of N-channel Metal-Oxide Semiconductor (NMOS) transistors.

7. The method of claim 1, further comprising:
   implanting a plurality of P-channel LDD (PLDD) regions in a first N-well and a second N-well;
   implanting a plurality of P+ regions in each of the plurality of PLDD regions; and
   forming a plurality of PMOS transistors.

8. The method of claim 1, wherein the depositing the first semiconductor substructure, depositing the first spacer layer over the first semiconductor substructure, depositing the second semiconductor substructure over the first spacer layer, and depositing the second spacer layer over the first spacer layer and the second semiconductor substructure comprises forming a poly-silicon to poly-silicon capacitor.

9. The method of claim 1, wherein a thickness of the first spacer layer is approximately equal to a thickness of the second spacer layer.

10. The method of claim 1, wherein a combined thickness of the first spacer layer and the second spacer layer is equal to a thickness within a range between 500 Angstroms and 5000 Angstroms.

* * * * *